United States Patent
Afghahi

(10) Patent No.: US 6,751,112 B2
(45) Date of Patent: Jun. 15, 2004

(54) DENSE CONTENT ADDRESSABLE MEMORY CELL

(75) Inventor: Morteza Cyrus Afghahi, Mission Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/375,880

(22) Filed: Feb. 26, 2003

(65) Prior Publication Data

US 2003/0198070 A1 Oct. 23, 2003

Related U.S. Application Data

(63) Continuation-in-part of application No. 10/127,175, filed on Apr. 22, 2002.
(60) Provisional application No. 60/448,551, filed on Feb. 19, 2003.

(51) Int. Cl.$^7$ .................... G11C 15/00; G11C 11/00; G11C 7/00
(52) U.S. Cl. .................. 365/49; 365/154; 365/156; 365/203
(58) Field of Search ................. 365/49, 154, 156, 365/203

(56) References Cited

U.S. PATENT DOCUMENTS

| | | | |
|---|---|---|---|
| 3,609,710 A | | 9/1971 | Browne .................... 340/173 |
| 5,475,633 A | | 12/1995 | Mehalel .................... 365/154 |
| 5,881,010 A | * | 3/1999 | Artieri ...................... 365/156 |
| 6,125,049 A | * | 9/2000 | Nataraj ..................... 365/49 |
| 6,157,557 A | * | 12/2000 | Lee et al. .................. 365/49 |
| 6,181,591 B1 | * | 1/2001 | Miyatake et al. ........... 365/156 |
| 6,195,278 B1 | * | 2/2001 | Calin et al. ................. 365/49 |
| 6,222,780 B1 | * | 4/2001 | Takahashi .................. 365/154 |
| 6,266,263 B1 | * | 7/2001 | Lien et al. ................. 365/49 |

OTHER PUBLICATIONS

Miyatake, H. et al., "A Design For High–Speed Low–Power CMOS Fully Parallel Content–Addressable Memory Macros", *IEEE Journal of Solid–State Circuits*, IEEE Inc., vol. 36, No. 6, Jun. 2001, pp. 956–968.

Noda, K. et al., "A 1.9–$\mu m^2$ Loadless CMOS Four–Transistor SRAM Cell in a 0.18–$\mu m$ Logic Technology", Electron Devices Meeting, 1998. *IEDM '98 Technical Digest.*, International San Francisco, CA, 1998, pp. 643–646.

Grosspietsch, K.E., "Associative Processors and Memories: A Survey", *IEEE Micro*, vol. 12, No. 3, Jun. 1, 1992, pp. 12–19.

"High Performance Static Content Addressable Memory Cell", *IBM Technical Disclosure Bulletin*, IBM Corp., vol. 32, No. 3A, Aug. 1, 1989 p. 478.

* cited by examiner

*Primary Examiner*—Trong Phan
(74) *Attorney, Agent, or Firm*—McAndrews, Held & Malloy, Ltd.

(57) ABSTRACT

A content addressable memory cell (10) comprises a word line 12, a first bit line (14), and a second bit line (16). A pair of transistors (30–31) is arranged to store bits of data at first and second points (35 and 36). A first transistor (26) is coupled to the word line, the first bit line and the first point. A second transistor (27) is coupled to the word line, the second bit line and the second point. A p-channel match transistor (40) is switchable to first and second states in response to different relationships between the stored bits and bits transmitted on the first bit line and the second bit line. A p-channel third transistor (50) couples the first bit line, first point and match transistor, and a p-channel fourth transistor (60) couples the second bit line, second point and match transistor.

10 Claims, 1 Drawing Sheet

DENSE CONTENT ADDRESSABLE MEMORY CELL

CROSS-REFERENCE TO RELATED APPLICATION

This is a continuation-in-part of U.S. application Ser. No. 10/127,175, filed Apr. 22, 2002. The applicant claims the benefit of the provisional application No. 60/448,551 filed Feb. 19, 2003, entitled "Dense Content Addressable Memory Cell."

BACKGROUND OF THE INVENTION

This invention relates to memory cells and more particularly relates to content addressable memory cells.

Many memory devices store and retrieve data by addressing specific memory locations. As a result, this path often becomes the limiting factor for systems that rely on fast memory access. The time required to find an item stored in memory can be reduced considerably if the stored data item can be identified for access by the content of the data itself rather than by its address. Memory that is accessed in this way is called content-addressable memory (CAM). CAM provides a performance advantage over other memory search algorithms (such as binary and tree-based searches or look-aside tag buffers) by comparing the desired information against the stored data simultaneously, often resulting in an order-of-magnitude reduction of search time.

A CAM cell is the basic circuit determining the speed, size and power consumption of a CAM system. Known CAM cells require a substantial number of transistors that consume power and require a substantial amount of area on a chip. In addition, match circuitry employed in known CAM cells requires a substantial amount of time for proper operation. This invention addresses these problems and provides a solution.

In the 0.13 micrometer and future process technologies, loss and gate leakage are becoming significant factors. Referring to FIG. 3, of U.S. Pat. No. 6,181,591 (Miyatake et al., issued Jan. 30, 2001, the "'591 patent"), node 18 will never be set to a full VDD supply voltage because NMOS transistors 16 and 17 can not pass a full VDD voltage. As a result, match transistor 25 always is partially on. Since many match transistors (e.g., 256) may be connected to the match line, the arrangement shown in the '259 patent will not work for current and future process technologies. This is particularly true at higher temperatures where the leakage current is very significant.

Another problem with current and future process technologies is gate leakage. NMOS transistor leakage is 5–10 time greater than PMOS gate leakage. If match transistor 25 shown in FIG. 3 of the '591 patent is used in connection with a four transistor SRAM cell, such as cell 11, the gate leakage of transistors 16 and 17 will make the design more difficult.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

One embodiment of the invention provides a content addressable memory cell comprising a word line, a first bit line and a second bit line. A pair of transistors is arranged to store a first bit of data at a first point and a second bit of data that is the complement of the first bit of data at a second point. A first transistor is coupled to the word line, the first bit line and the first point. A second transistor is coupled to the word line, the second bit line and the second point. A PMOS match transistor is switchable to a first state in response to a first predetermined relationship between the first and second bits and third and fourth bits transmitted on the first bit line and the second bit line and is switchable to a second state in response to a second predetermined relationship between the first and second bits and the third and fourth bits. A p-channel third transistor couples the first bit line, first point and match transistor, and a p-channel fourth transistor couples the second bit line, second point and match transistor.

By using the foregoing type of cell, the number of transistors in the CAM can be reduced and the speed of operation can be increased. The power consumption of the cell can be reduced. By using p-channel transistors for the third and fourth transistors, the need for precharging of the match transistor gate can be eliminated, because the gate of the match transistor can be charged to full VDD voltage during the BIT and BIT precharge. This guarantees that the leakage current of the transistor 40 is insignificant.

These and other advantages and novel features of the present invention, as well as details of an illustrated embodiment thereof, will be more fully understood from the following description and drawings.

DETAILED DESCRIPTION OF THE INVENTION

Figure 1:
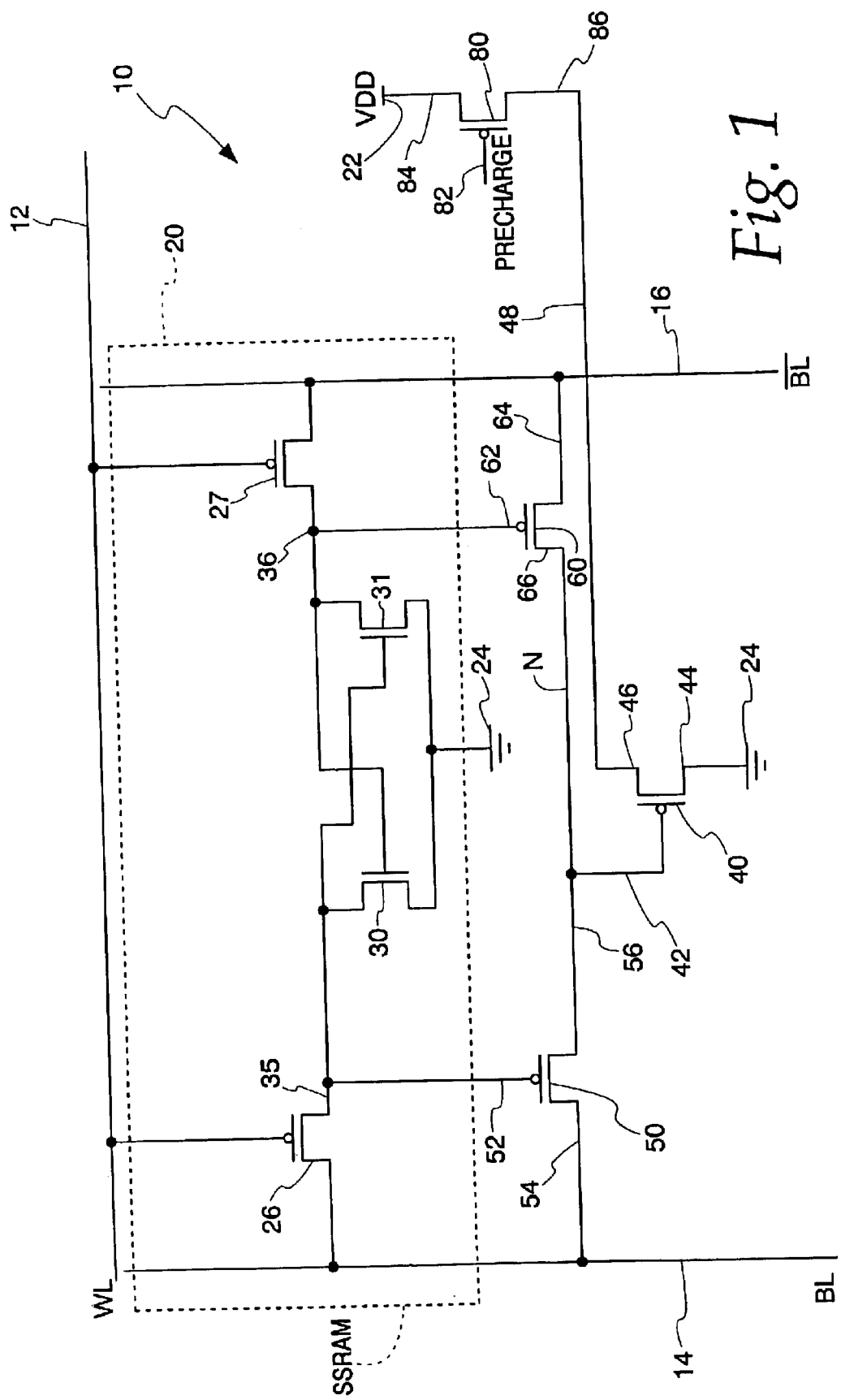
FIG. 1 is a schematic diagram of one embodiment of the invention.

Referring to FIG. 1, one embodiment of a CAM cell 10 embodying the invention includes a word line 12 and bit lines 14 and 16. Cell 10 includes a semi-static (SSRAM) or dynamic random access memory type circuit 20 including a source 24 of a reference voltage, such as ground potential. Circuit 20 also includes p-channel transistors 26–27 and n-channel transistors 30–31 cross-coupled as shown. Transistors 26–27 serve as both reading and writing transistors also called access and loading transistors. Transistors 26–27 may comprise low voltage threshold transistors in order to compensate for the leakage in circuit 20. To make sure that the leakage through the p-channel transistors compensates for the leakage through the n-channel transistors, the voltage on word line 12 can be adaptively changed for proper operation at all process corners and temperatures. If necessary, line 12 is reduced in voltage below VDD (the supply voltage) so that transistors 26 and 27 are partially conductive, thus allowing current conduction that compensates for leakage by transistors 30 and 31. In addition, p-channel transistors 26–27 are better than n-channel transistors to supply charges at circuit points 35 and 36 to maintain the stored data. Bit lines are kept at VDD (precharged) in a default or a no activity state to provide the charges.

Thus, the embodiment shown in FIG. 1 is able to store complementary bits of data with only four transistors, while conventional SRAM cells require six transistors. By using the embodiment shown in FIG. 1, substantial area is saved on a chip incorporating the cell shown in FIG. 1.

Voltage levels corresponding to stored data bits are stored at points 35–36 of circuit 20. The data bits stored at points 35–36 are complements of each other.

Test bits of data are transmitted on bit lines 14 and 16. The test bits of data also are complements of each other.

A switching p-channel match transistor 40 comprises a gate 42 connected to a node N, a source 44 and a drain 46 that is connected to a word match line 48. A p-channel transistor 50 comprises a gate 52 connected to point 35, a source 54 connected to line 14 and a drain 56 connected to node N as shown. A p-channel transistor 60 comprises a gate 62 connected to point 36, a source 64 connected to line 16 and a drain 66 connected to a node N as shown.

A precharge p-channel transistor 80 comprises a gate 82 connected to a precharge circuit (not shown), a source 84 connected to source 22 of voltage and a drain 86 connected to line 48 as shown.

In each of the foregoing transistors, the source-drain path forms a circuit path.

In the precharge state, both lines 14 and 16 are precharged to a logical one state (e.g., to a voltage near VDD) and node N also is precharged to a logical one state (e.g., to a voltage near VDD) through transistors 50 or 60, causing match transistor 40 to be completely cut off. The match line 48 also is precharged to VDD.

In the compare state, one of lines 14 and 16 is driven to a logical zero state (e.g., to a voltage near ground potential). If there is a mismatch between the data stored at points 35–36 and the test data represented by the logical states of lines 14 and 16, node N is switched to a logical zero state, causing transistor 40 to discharge the voltage of match line 48 to a level below a logical one (VDD) state. Transistor 40 does not discharge match line 48 down to zero volts. As a result, power is saved. A sense amplifier (not shown) detects whether the match line 48 has gone below VDD.

For example, a mismatch occurs if a logical one is stored at point 35, a logical zero is stored at point 36, a logical zero is transmitted on line 14 and a logical one is transmitted on line 16. Conversely, a match occurs if a logical one is stored at point 35, a logical zero is stored at point 36, a logical one is transmitted on line 14 and a logical zero is transmitted on line 16.

In case of a match, the gate of transistor 40 stays at VDD, keeping transistor 40 in an off state. The match line then does not discharge through transistor 40; the match line 48 stays at VDD.

While the invention has been described with reference to one or more preferred embodiments, those skilled in the art will understand that changes may be made and equivalents may be substituted without departing from the scope of the invention. In addition, many modifications may be made to adapt a particular step, structure, or material to the teachings of the invention without departing from its scope. Therefore, it is intended that the invention not be limited to the particular embodiment disclosed, but that the invention will include all embodiments falling within the scope of the appended claims.

What is claimed is:

1. A content addressable memory cell comprising:
   a word line;
   a first bit line;
   a second bit line;
   a pair of transistors arranged to store a first bit of data at a first point and a second bit of data that is the complement of the first bit of data at a second point;
   a first transistor coupled to the word line, the first bit line and the first point;
   a second transistor coupled to the word line, the second bit line and the second point;
   a p-channel match transistor switchable to a first state in response to a first predetermined relationship between the first and second bits and third and fourth bits transmitted on the first bit line and the second bit line and switchable to a second state in response to a second predetermined relationship between the first and second bits and the third and fourth bits;
   a p-channel third transistor coupling the first bit line, first point and match transistor; and
   a p-channel fourth transistor coupling the second bit line, second point and match transistor.

2. The cell of claim 1 wherein each of the first transistor and second transistor comprises a variable threshold transistor.

3. The cell of claim 2 wherein each of the variable threshold transistors comprises a low threshold variable threshold transistor.

4. The cell of claim 1 wherein each of the third transistor and fourth transistor comprises a p-channel metal oxide silicon field effect transistor (MOSFET).

5. The cell of claim 4 wherein the match transistor comprises a p-channel MOSFET.

6. The cell of claim 1 wherein the match transistor comprises a gate and an output circuit path coupled to a match line and wherein the cell further comprises a node interconnecting the gate, the third transistor and the fourth transistor.

7. The cell of claim 1 and further comprising a precharge transistor arranged to precharge the match line.

8. The cell of claim 1 wherein the first transistor is arranged to read data from the first point and is arranged to write data to the first point and wherein the second transistor is arranged to read data from the second point and is arranged to write data to the second point.

9. The cell of claim 1 wherein the cell comprises a semi-static cell, whereby chip fabrication area is reduced.

10. The cell of claim 1 wherein the cell comprises a dynamic cell, whereby chip fabrication area is reduced.

* * * * *